(12) United States Patent
Scholte Van Mast et al.

(10) Patent No.: US 8,491,252 B2
(45) Date of Patent: Jul. 23, 2013

(54) TRANSPORT METHOD FOR DISK-SHAPED WORKPIECES

(75) Inventors: Bart Scholte Van Mast, Azmoos (CH); Holger Christ, Truebbach (CH)

(73) Assignee: OC Oerlikon Balzers Ltd., Furstentum (LI)

( * ) Notice: Subject to any disclaimer, the term of this patent is extended or adjusted under 35 U.S.C. 154(b) by 550 days.

(21) Appl. No.: 12/848,746

(22) Filed: Aug. 2, 2010

(65) Prior Publication Data

US 2010/0316483 A1 Dec. 16, 2010

Related U.S. Application Data

(62) Division of application No. 11/588,165, filed on Oct. 26, 2006, now abandoned.

(30) Foreign Application Priority Data

Nov. 17, 2005 (CH) .................................. 1843/05

(51) Int. Cl.
*H01L 21/677* (2006.01)

(52) U.S. Cl.
USPC .......................................... 414/805; 414/941

(58) Field of Classification Search
USPC ...... 414/217, 805, 807, 941; 700/259; 294/1.1
See application file for complete search history.

(56) References Cited

U.S. PATENT DOCUMENTS

| | | | | |
|---|---|---|---|---|
| 5,239,182 A | * | 8/1993 | Tateyama et al. | 250/559.37 |
| 5,830,272 A | * | 11/1998 | Begin et al. | 118/500 |
| 6,059,517 A | * | 5/2000 | Begin | 414/744.6 |
| 6,117,238 A | * | 9/2000 | Begin | 118/500 |
| 6,634,686 B2 | * | 10/2003 | Hosokawa | 294/213 |
| 6,822,413 B2 | * | 11/2004 | Simondet | 318/568.21 |
| 7,033,126 B2 | * | 4/2006 | Van Den Berg | 414/416.03 |
| 7,073,834 B2 | * | 7/2006 | Matsumoto et al. | 294/213 |
| 7,482,555 B2 | * | 1/2009 | Liu et al. | 219/390 |
| 2003/0202865 A1 | * | 10/2003 | Ponnekanti et al. | 414/217 |
| 2007/0246957 A1 | * | 10/2007 | Liu et al. | 294/1.1 |

* cited by examiner

*Primary Examiner* — Joshua Rudawitz
(74) *Attorney, Agent, or Firm* — Notaro, Michalos & Zaccaria P.C.

(57) ABSTRACT

A transport method for disk-shaped semiconductor wafer workpieces has a horizontally movable transport arm with two elongated carrying elements at one end, for receiving the workpiece. A cassette which includes a comb structure at each side for receiving several workpieces, is inserted free of contact between two adjacent combs with workpieces therein for vertically lifting a workpiece. The carrying elements are disposed such that during a cassette engagement they are each positioned substantially adjacent and parallel to the comb structure along a comb, and in this region along and between two adjacent comb planes on one side of the cassette, a scanning beam is provided for workpiece acquisition. The scanning beam is relatively height-positionable with respect to the cassette and is tilted about a small angle with respect to the horizontal workpiece plane.

19 Claims, 10 Drawing Sheets

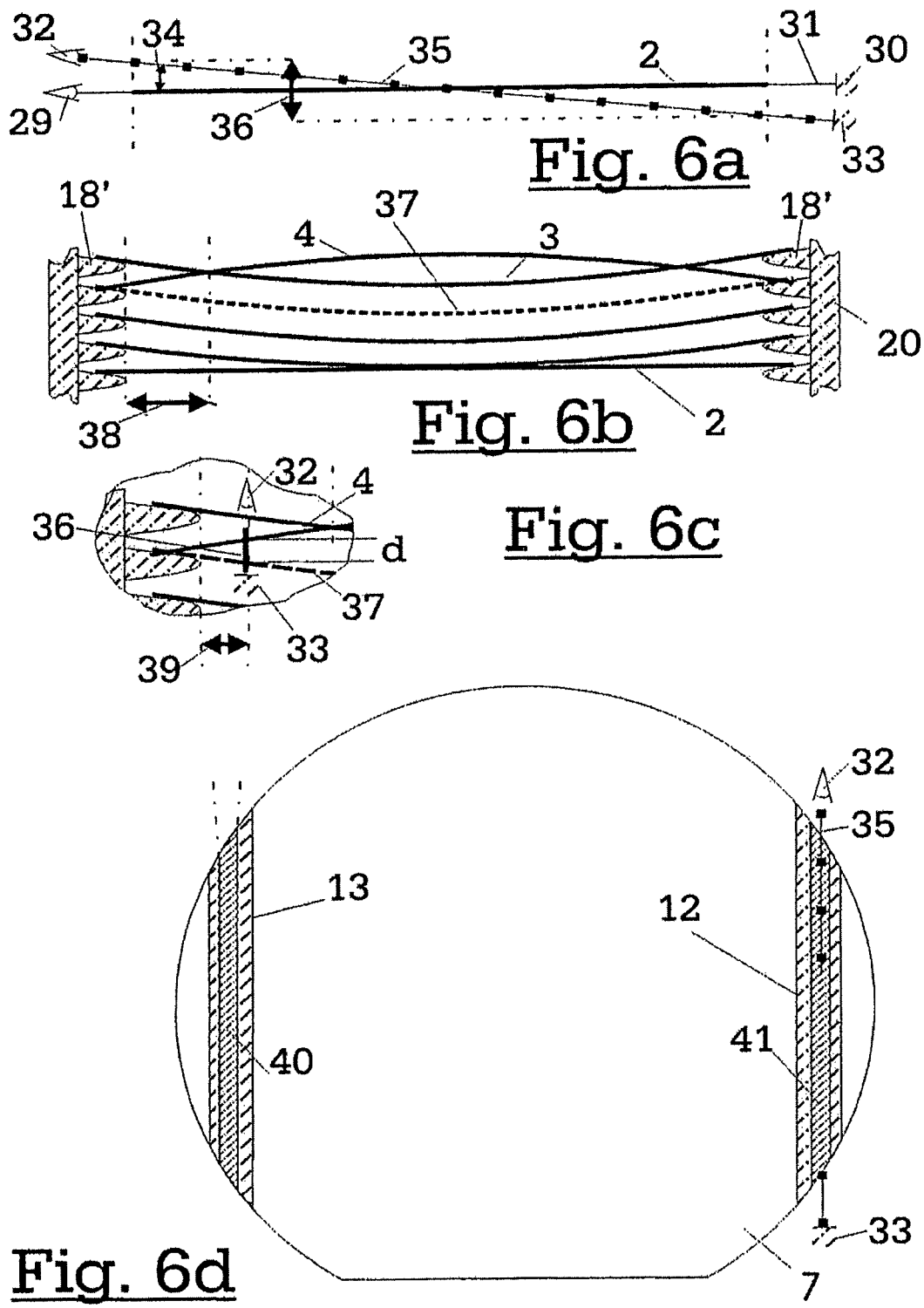

TRANSPORT METHOD FOR DISK-SHAPED WORKPIECES

CROSS REFERENCE TO RELATED APPLICATIONS

This is a divisional of application Ser. No. 11/588,165, filed Oct. 26, 2006 which is incorporated herein by reference, and which claimed priority on Swiss application no. 2005 01843/05 filed Nov. 17, 2005, which priority claim is repeated here.

FIELD AND BACKGROUND OF THE INVENTION

The invention relates to a transport mechanism for disk-shaped workpieces, in particular for semiconductor wafers.

In modern vacuum process facilities circular flat substrates or workpieces, which are also referred to as wafers, are surface treated, such as for example coated, etched, cleaned, thermally treated etc., in such fully automated vacuum process systems. In order to automate such processes and to be able to carry out multi-stage processes in different facility areas, automated transport systems, a type of handling robot, are employed. In particular the treatment of semiconductor wafers in such processes requires very high quality of treatment, such as in particular high cleanliness, high precision and careful treatment of the substrates. Due to the stated high requirements, such facilities preferably include a lock chamber, where the wafers are moved from the atmospheric environment into a vacuum chamber and subsequently into a process station or, as a rule, sequentially into several process stations in order to be able to carry out the required surface treatment. With the aid of a transport device the wafers are delivered in a horizontal transport plane from the lock chamber into the process chamber, and after the wafer has been deposited in the process chamber, the latter is, as a rule, closed in order to be able to carry out the process under the required vacuum and process conditions. If several process steps are necessary, the wafer is again transported out of the one process chamber in the same manner and, for the next process step, is transported into another process chamber. Especially preferred types of facilities are so-called cluster systems. In such systems, the lock chamber and the process chamber, or the several chambers, are arranged peripherally about the substantially central transport chamber. In the case of more than one lock chamber and in particular in the case of several process chambers, these chambers are arranged in a type of star-shaped configuration about the centrally located transport chambers. The transport device in this case is located in this centrally located transport chamber and has access, on the one hand, to the at least one lock chamber and, on the other hand, to the process chamber. Between the transport chamber and the remaining chambers conventionally and preferably a so-called lock valve is disposed in order to be able to partition the chambers against one another during the locking process or during the process step. During the transport process of a wafer, the transport device subsequently extends appropriately through the open lock gates in order to deposit the wafer at the designated location.

The transport device moves the wafer translatively in one plane and consequently in two directions of motion. In said preferred cluster systems with the transport device disposed in the central transport chamber, the device is conventionally formed as a mechanism which pivots about a center of rotation and forms therewith the one rotating direction of motion and which can execute a further second translatory motion radially with respect to the center of rotation back and forth away from/to this center of rotation. On this transport device, for example a length-adjustable arm mechanics rotatable in the horizontal plane, the wafer to be transported is subsequently deposited in the end region of this arm. Such a configuration can in this case readily also transport a wafer over relatively great path distances, for example of the orders of magnitude of 1 m or more, from a lock chamber into the transport chamber and from here, in turn, into and out of the process chamber and extend through the corresponding opened lock doors. At the beginning of the transport cycle the wafer is deposited under atmospheric pressure onto the transport mechanism as precisely as possible and always in the same position in order to be able to transport it subsequently also precisely to a predetermined position. However, the deposition of the wafer on the transport mechanism, as well as also the transport mechanism itself, is afflicted with imprecisions or with tolerance errors. Further imprecisions or shifts of the wafer position on the transport mechanism can also occur in the process station due to effects in the process chamber.

A particular problem in the handling of disk-shaped workpieces occurs if the workpieces are very thin relative to the diameter and deflect correspondingly strongly. This is in particular the case with semiconductor wafers, which have perhaps a thickness of a few tenths of a millimeter, such as preferably 0.07 to 0.3 mm at a diameter of 100 mm to 300 mm. Depending on the type of support the deflection may be in the range on a few tenths of a millimeter up to a few millimeters. This makes precise handling and positioning within a transport configuration considerably more difficult especially since the deflection can be of different magnitudes. Especially problematic is the handling or transfer of semiconductor disks from a cassette into the designated positions, such as process stations or chambers of a vacuum process facility. In such facilities the semiconductor wafers are deposited horizontally in magazines formed as cassettes and again removed horizontally from them, in order to intermediately store them on compact space. Special difficulties are encountered with wafers which deflect strongly, with respect to handling precision and desired compactness of the configuration and reliability of the handling.

EP 0 696 242 B2 discloses a transport mechanism for semiconductor wafers which permits lifting and depositing circular semiconductor disks, or disk-shaped workpieces, with the aid of a height-adjustable handling robot rotating about its axis with a carrying arm or carrying element extensible in the horizontal plane or to deposit them and bringing them into a different position. Therewith it is possible for example to remove workpieces with a transport arm from a cassette and transport them into a different position, where they can, for example, be worked. In vacuum process facilities the workpieces must be moved in and out through a lock, be that from atmospheric pressure into the facility or within the facility between different chambers. The previously described transport arm of the robot, if needed and under control, reaches through the corresponding lock gates for the transportation of the workpiece to the correct target location. Depending on the concept of the facility, for the intermediate storage of the workpieces cassettes are utilized which can hold several workpieces in a small space and can be employed either outside of the facility and/or inside the facility. The arrangement introduced in the patent permits realizing transport mechanisms of this type. The underlying assumption in these known transport mechanisms is that the workpiece remains flat as defined and that its dimensions are also defined. The handling as well as also the substrate acquisition with the appropriate electronic or optical sensors build on these prerequisites.

However, for large-area thin workpieces, which deflect strongly, considerable problems are encountered with this mechanism and a solution of them is not provided. In these cases such transport mechanisms are correspondingly functionally also operated at their limit, which decreases the operational reliability of such facilities.

SUMMARY OF THE INVENTION

The present invention addresses the task of eliminating the previously listed disadvantages of prior art. The task consists in particular in realizing a mechanism and a method for the transport of thin flexible disk-shaped workpieces, in particular of semiconductor disks, which permit high precision and reliability, in particular as much as possible without workpiece defects, with which high economy in the production process can be attained.

According to the invention the task is solved through a transport mechanism and method for workpieces according to the invention and with a method according to the invention. The claim define the various advantageous embodiments of the invention.

According to the invention the solution is comprised by permitting the deflection of the flat workpiece up to the natural form and the handling and detecting takes this deformation of the workpiece into consideration and is referenced and oriented to positions or places which are clearly defined at the beginning of the transport process and are maintained during the entire process. All handling and detection elements are focused under consideration of the tolerance ranges and their limits which are given mechanically and electrically through the participating mechanism in the process facility referenced to the starting position of the workpiece in the process facility. The process facility is so realized that none of the regions not located within these clearly defined zones can have a significant effect on the function or the reliability of the transport or handling process.

The invention comprises a transport mechanism and method for disk-shaped workpieces, in particular for semiconductor wafers, with a controlled, horizontally movable transport arm at the one end of which two elongated carrying elements are disposed at a spacing for the substantially horizontal reception of the workpiece and that a cassette is provided which at two opposing sides has a comb structure for the substantially horizontal reception of several workpieces, the carrying elements and the comb structure being formed such that they can be introduced free of contact between two adjacent spaced-apart combs of the comb structure with the workpieces potentially disposed therein for the lifting or deposition of a workpiece with the aid of an additional vertical motion relative with respect to the cassette and the transport arm, the carrying elements being disposed such that during the cassette engagement they are substantially each positioned adjacent parallel to the comb structure along a comb and that in this region along and between two adjacent comb planes on one side and/or both sides of the cassette a scanning beam is provided for acquiring a workpiece and its position, and that the scanning beam can be height-positioned relatively with respect to the cassette, the scanning beam with respect to horizontal workpiece plane being guided at a small-angle tilt.

The various features of novelty which characterize the invention are pointed out with particularity in the claims annexed to and forming a part of this disclosure and are entirely bases on the priority application no. 2005 01843/05 filed in Switzerland on Nov. 17, 2005, incorporated here by reference. For a better understanding of the invention, its operating advantages and specific objects attained by its uses, reference is made to the accompanying drawings and descriptive matter in which a preferred embodiment of the invention is illustrated.

BRIEF DESCRIPTION OF THE DRAWINGS

In the following the invention will be explained in further detail by example and in conjunction with schematic figures which depict views as follows:

FIG. 4a is a cassette in cross section corresponding to FIG. 3a;

FIG. 6a is a workpiece in cross section with demonstration of the scanning beams along the comb structure;

FIG. 6b is a cross section of workpieces deposited in the cassette with different possible deflections;

FIG. 6c is a detail according to FIG. 6b on one side of the cassette in the region of the support and in cross section with respect to the scanning beam;

FIG. 6d is a top view of a workpiece in the cassette with demonstration of the imaging zones of the scanning beam on the workpiece;

FIG. 8b is a cross section of a detail in the proximity of the comb structure of the cassette according to FIG. 8a;

DESCRIPTION OF THE PREFERRED EMBODIMENTS

Figure 10A:
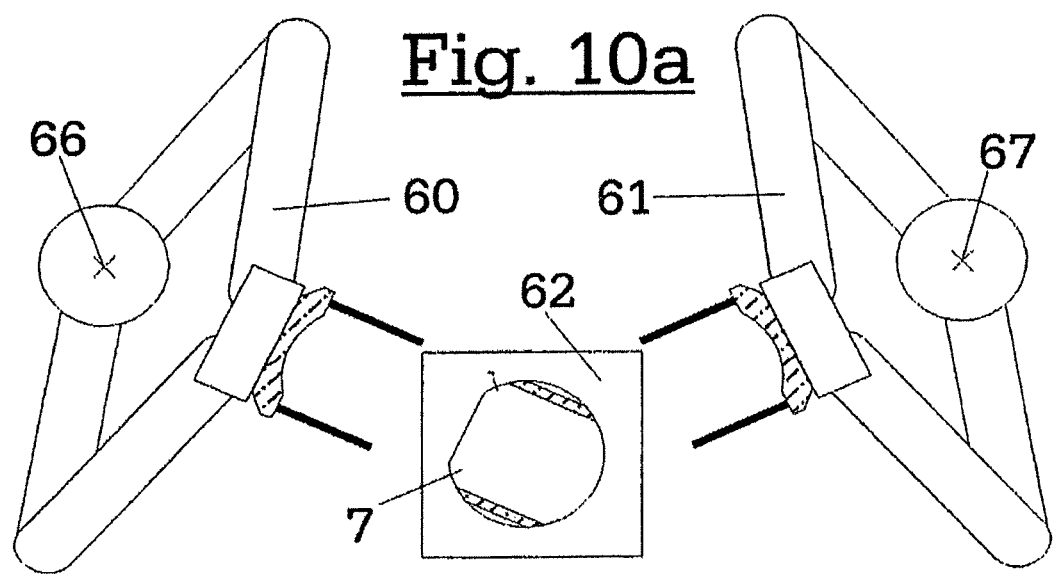
FIG. 10a is a top view of a transport device with two transport robots.

In fully automated vacuum process facilities for the surface working of disk-shaped workpieces and in particular of semiconductor wafers of silicon and/or germanium it is necessary to transport these precisely with robot devices. The transport of these workpieces from one position into the other position must take place such that it is precisely reproducible and without causing damage to the workpiece. Several workpieces 7 are for this purpose deposited into a cassette 20 or removed from it, in order to be transported for example from atmospheric pressure into a vacuum through a lock, in order to be subsequently worked. After the working in a process station, for example after coating or etching of the workpiece, these are again guided back with the aid of the handling robot through the lock into the cassette. Vacuum process facilities may also comprise several process stations, which are tended with one or several handling robots. In such process facilities the flat disk-shaped workpieces 7 are conventionally transported in the horizontal direction. For this purpose are employed handling robots, which can be rotated about their own axes 66, 67 and which have a transport arm 61, 60 which can be extended in the horizontal direction laterally to the rotational axis 66, 67, in order to be able to transport a workpiece 7 in the lateral direction to these axes, such as is schematically shown in FIG. 10a in top view. The receiving or depositing of the workpiece takes place thereby that the carrying elements 26, 27 are moved under the workpiece 7 and subsequently is lifted or deposited with a vertical relative motion from the cassette 20 or a base 62, 42, 50 through relative movement. The relative movement is generated thereby that either the cassette or the base is correspondingly moved vertically or preferably the handling robot is moved correspondingly vertically. These processes must be carried out highly precisely and no grinding or frictional movements must be generated at the participating elements, which would lead to undesirable abrasion and particle formation, which would unfavorably affect the sensitive vacuum processes and would lead to rejects in the production. The situation is additionally made difficult if thin large-area disk-shaped workpieces 7 are to be worked and must be transported since such workpieces can have a strong deflection or warp and may thereby impair the reliable function of the transport mechanism. To increase the economy in the semiconductor production further, increasingly greater diameters of workpiece disks are utilized today and these are additionally increasingly becoming thinner, whereby the bending problem is exacerbated. Today disk diameters of 100 mm to 300 mm are utilized having thicknesses of 0.07 mm to approximately 0.6 mm. Depending on the ratio, deflections result therefrom which are in the range of a few tenths millimeter or may even go up to several millimeters.

Figure 1:
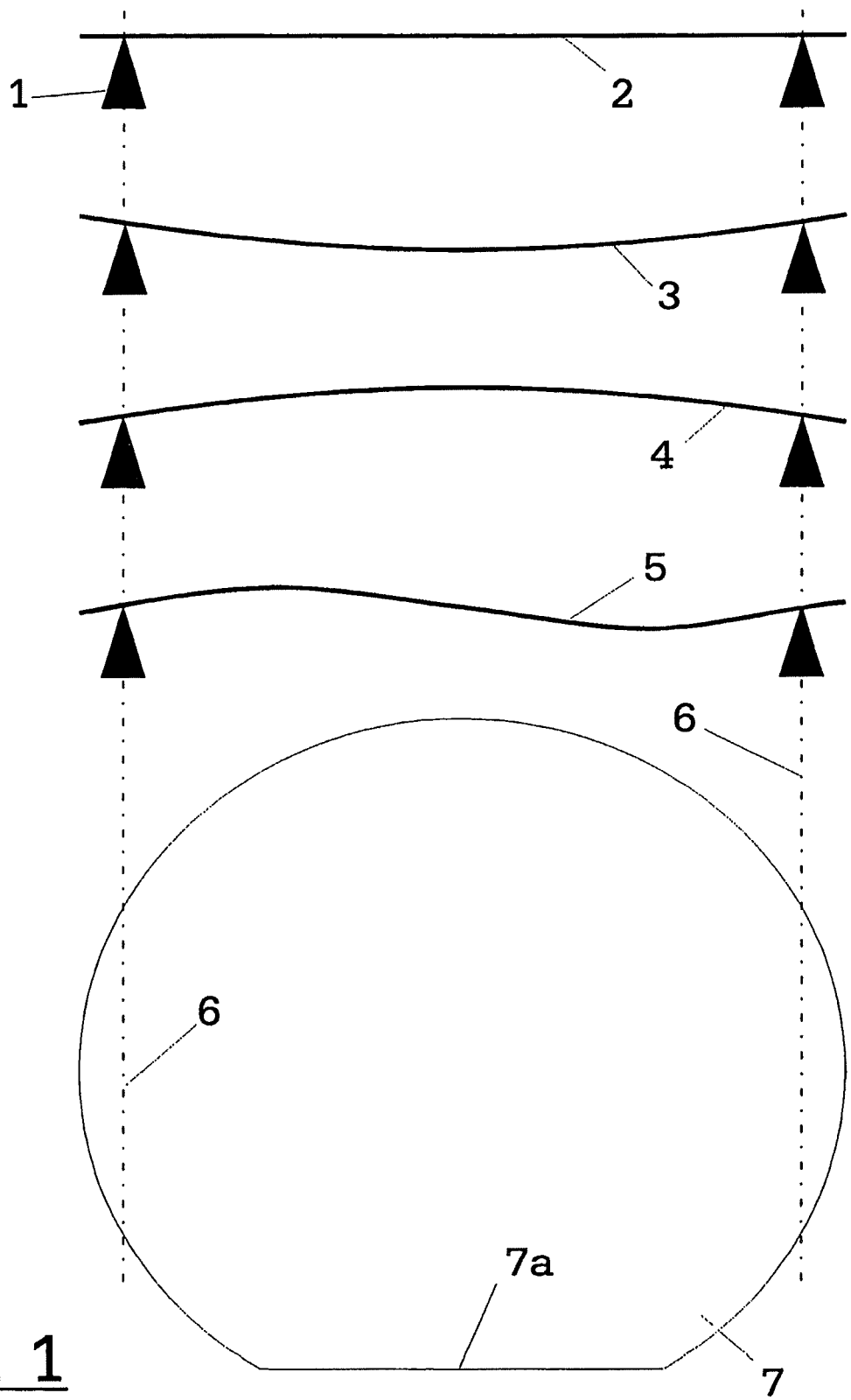
FIG. 1 is a disk-shaped workpiece, such as a semiconductor wafer, in top view and in different cross sections with different examples of deflection.

For the support of workpieces 7 two line-form supports 1, which form the carrying elements 26, 27 are preferably provided, as is shown schematically in FIG. 1. The line-form supports 1 are substantially aligned parallel to one another and spaced apart from one another such that the disk-shaped workpiece 7 is stayed in the margin region on both sides along the support line 6 on the supports 1. These two supports 1 are preferably formed as rod-shaped carrying elements 26, 27. FIG. 1 shows as the workpiece a semiconductor wafer with different types of possible deflections. A relatively thick wafer 2 has essentially no deflection and rests flat on the supports 1. Thin wafers can deflect downwardly 3 due to their own weight or upwardly 4 due to internal stress. These deflections conventionally have cylindrical form, however, they may also be formed of a combination of several cylindrical forms, which are oriented differently. This combination of deflections subsequently leads to a deflection profile 5, which has a saddle-shaped warping of the wafer. In standard vacuum process facilities for working semiconductor disks, these are introduced in cassettes containing several wafers. In such cassettes 20 the wafers rest with their margin region in contact on stays guided in parallel, such that the surface of the workpiece is substantially free. Only the zone of the wafer in the region of the stayed region is hereby well defined in the vertical position independently of the magnitude of the deflection of the workpiece. This position can be characterized through two support lines 6, which form two chords in the region of the periphery of the wafer 7. Locations on the wafer face too far removed from these support lines 6, are not known or not defined in their vertical position.

Figure 2A:
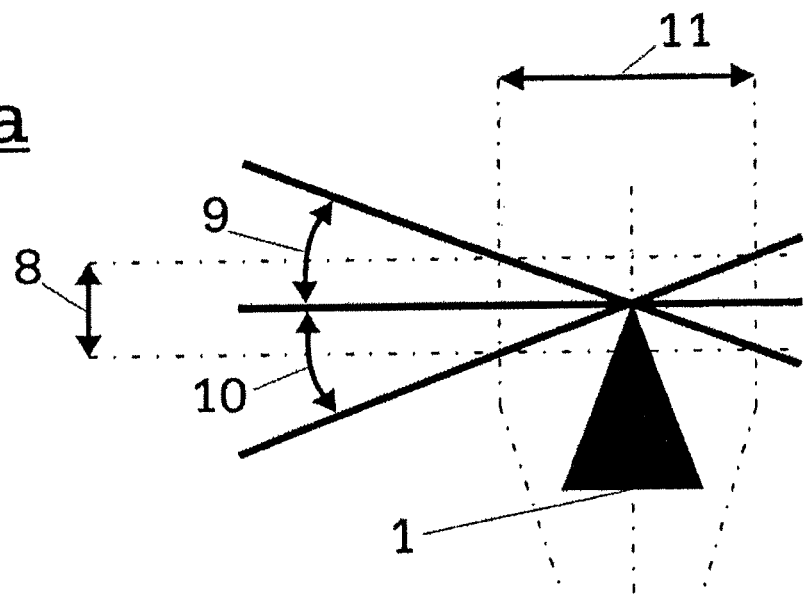
FIG. 2a is a workpiece in the region of the support with the maximally possible deflections.
Figure 2B:
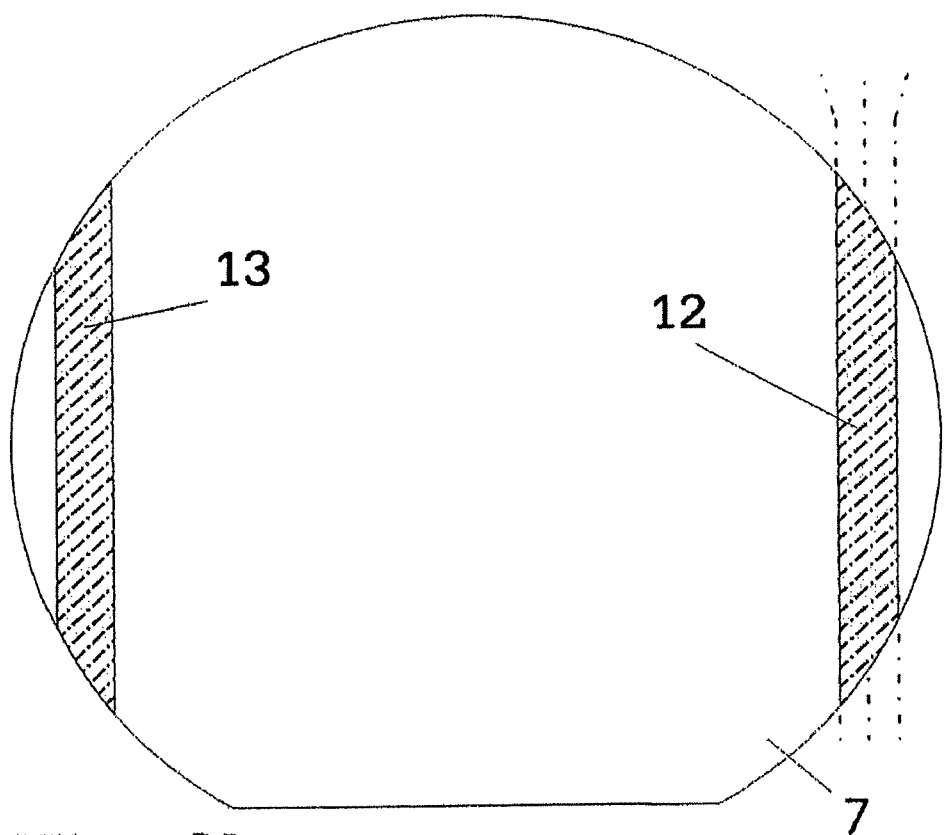
FIG. 2b is workpiece in top view with defined possible support regions, the handling zones.

In order to define an area about the support lines 6 which can be utilized for the handling, thus for the staying and detecting of the wafer, the system tolerance region 8 in the vertical direction is determinant, as is shown in FIG. 2a in cross section. If the maximally possible deflections upwardly 9 and downwardly 10 of the workpiece are taken into consideration, an angle deviating from the horizontal results, the upward angle 9 and the downward angle 10 with respect to support 1, from which subsequently the maximum handling zone width 11 can be defined, which define the handling zones 12, 13 on the workpiece on both sides. Thus, virtually two spaced-apart, parallel strip-shaped handling zones 12, 13 result, which are located in the peripheral region of the disk-shaped workpiece, as is depicted in top view in FIG. 2b.

Figure 3A:
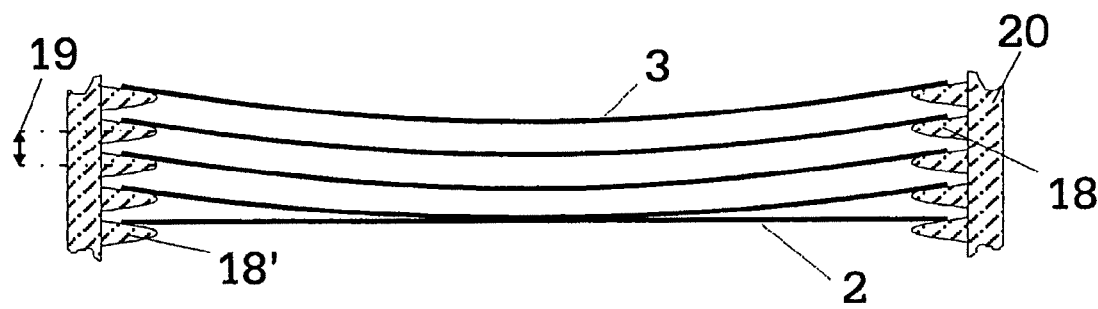
FIG. 3a is a cassette in cross section with several workpieces deposited therein and partially bent.
Figure 3B:
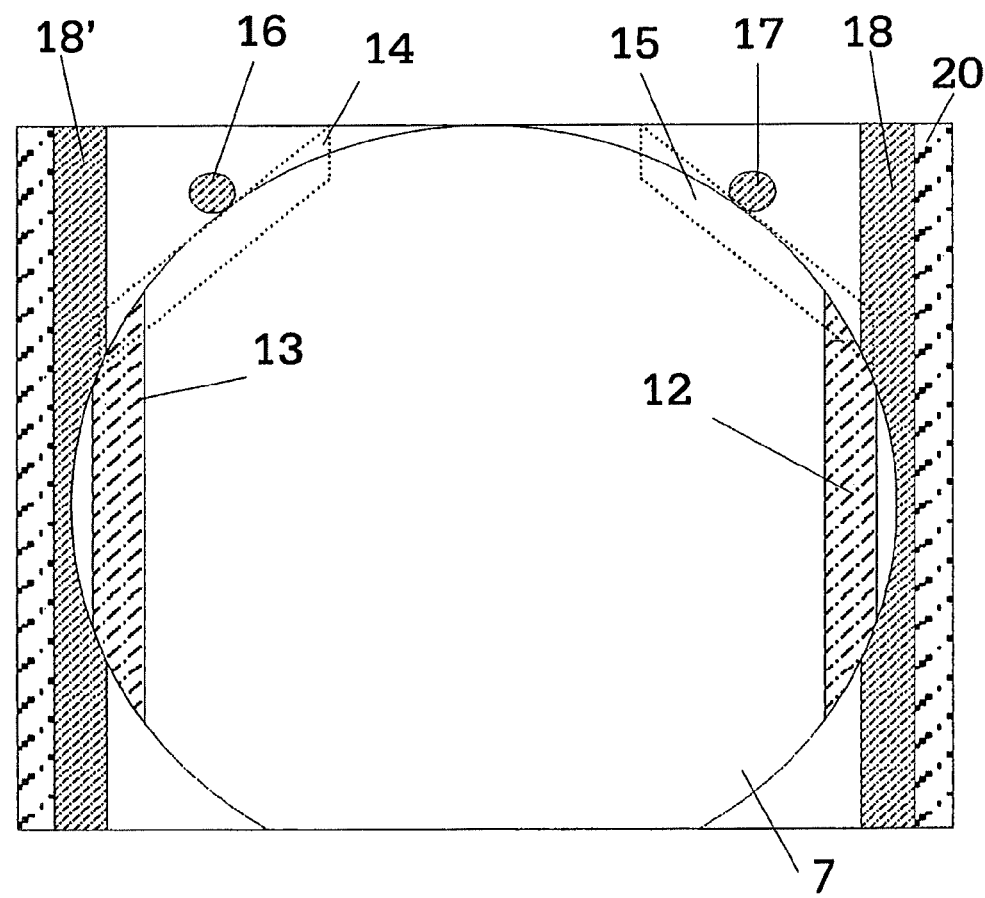
FIG. 3b is a cassette in top view with a workpiece.

If the rules as they were previously defined are applied to a cassette 20 for thin workpieces 7, it is evident that the support zones of the workpiece 7 are limited to two parallel zones 12, 13 in the proximity of the periphery of the workpiece 7, as is shown in FIG. 3a in cross section and in top view in FIG. 3b. In conventional wafer cassettes 20 according to the SEMI standard, on each side of the workpiece one additional end support means 14, 15 is disposed which projects into the interior region of the cassette 20. Such inwardly projecting support means 14, 15, shown in dashed lines in FIG. 3b, cannot be utilized in the present invention. In order to limit or to define the horizontal position of the workpiece 7 in the cassette, stop means 16, 17 must be provided which only occupy as spots the interior region of the cassette between the supports 18, 18' or permit in the region of the supports and the handling zones 12, 13 the detection means to extend between and along them. Thin rod-shaped elements 16, 17 are therefore preferred as the stop means. The cassette 20 has a comb-shaped structure 18, 18' on both sides, which forms a slot-form configuration capable of receiving and staying the disk-shaped workpieces 7 in the peripheral region. The cassette 20 thereby forms a configuration with several receiving slots for the reception of several workpieces 7. It is important that the comb structure has a comb distance 19 large enough to avoid that adjacently inserted workpieces 7 do not come into contact even in the presence of deflections. If, for example, workpieces 3 are utilized which bend downwardly and workpieces 2 which are flat, the comb distance 19 must be greater than the downwardly directed deflection 3 of the workpiece 7. If workpieces 7 are utilized, which deflect upwardly as well as downwardly, the comb distance 19 must be greater than the sum of the maximally expected bending upwardly and downwardly.

Figure 5:
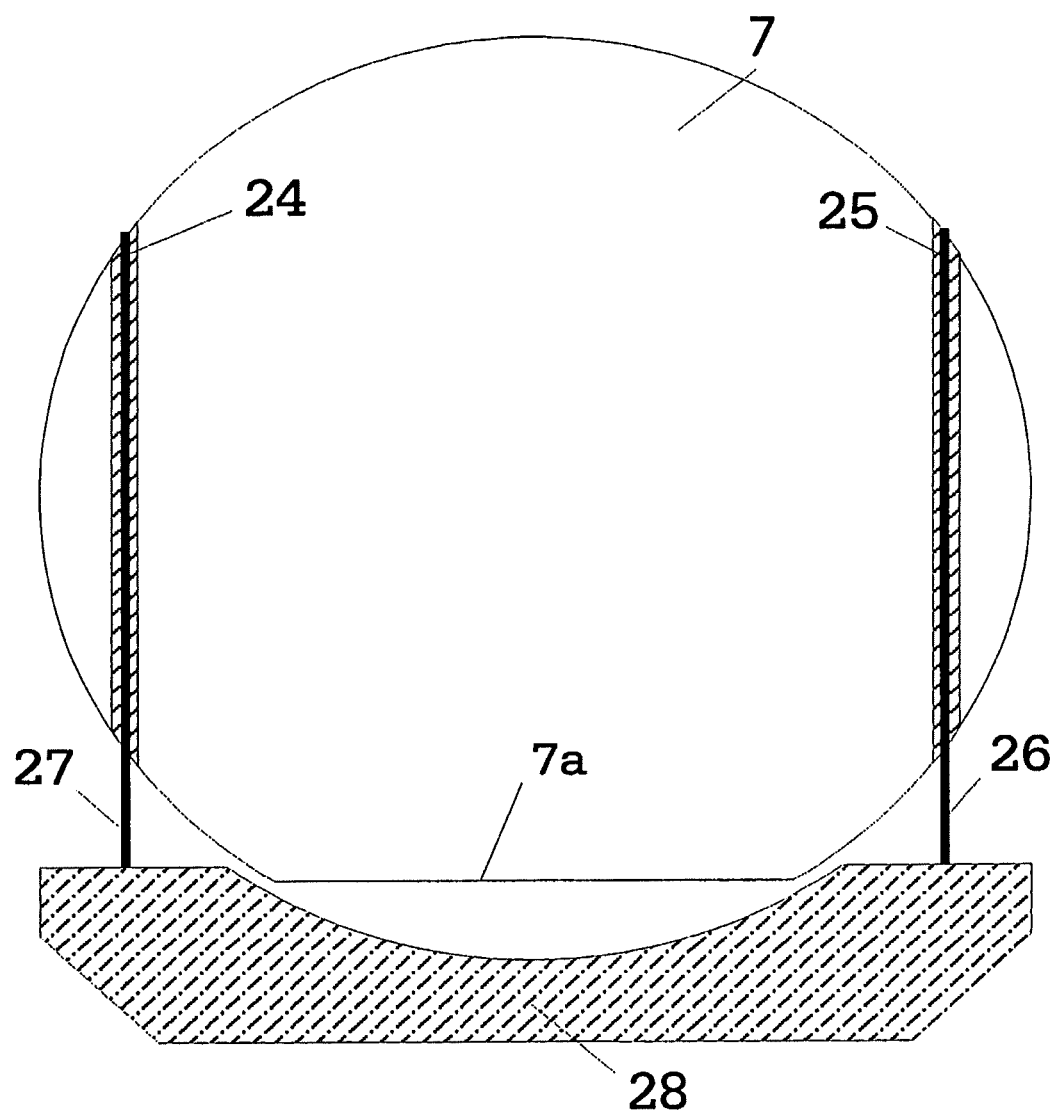
FIG. 5 is a workpiece in top view with demonstration of the support on the carrying elements which are overlaid within the permissible handling zones.

To be able to lift and carry the workpiece 7, carrying elements 21, 22 are located at the end of the robot carrying arm, onto which the workpiece 7 is deposited. On the horizontally movable carrying arm of the robot a carrying element mounting 28 is disposed and on this mounting two elongated spaced-apart carrying elements 26, 27 are disposed in parallel, which are preferably formed in the shape of rods, as is depicted in FIG. 5 in top view. FIG. 5 shows the manner in which a disk-shaped workpiece, a semiconductor wafer 7, is deposited on the carrying elements 26, 27. The thickness of the carrying elements 26, 27 is limited, this means they must be sufficiently thin such that they provide separation between two adjacent workpieces 7 in the cassette without touching it for the succeeding lifting process or after the deposition of a workpiece 7 in the cassette. The carrying elements 26, 27 are therefore preferably implemented in the form of rods and must have sufficient rigidity in order not to be bent in an undesirable manner which would additionally increase the handling tolerances.

Figure 4A:
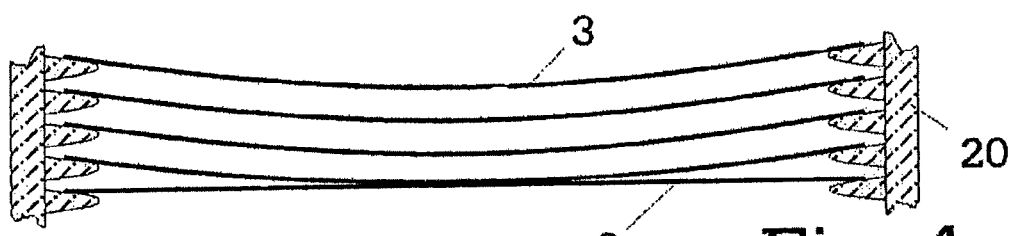
Figure 4B:
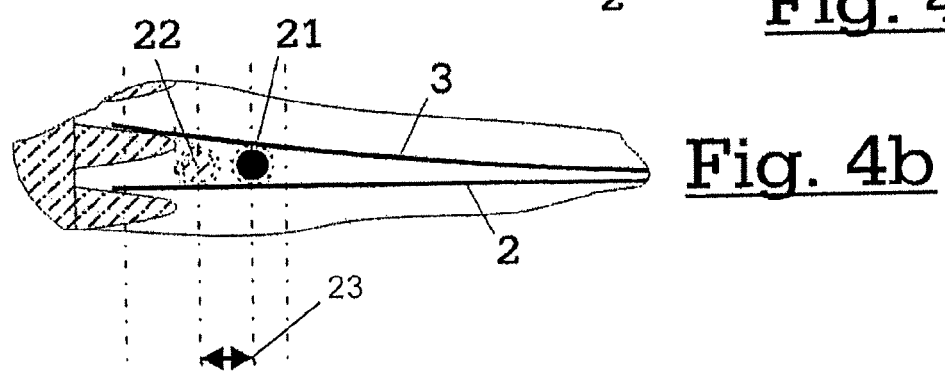
FIG. 4b is a detail of the cassette with comb structure on one side with a workpiece in the region of the support.
Figure 4C:
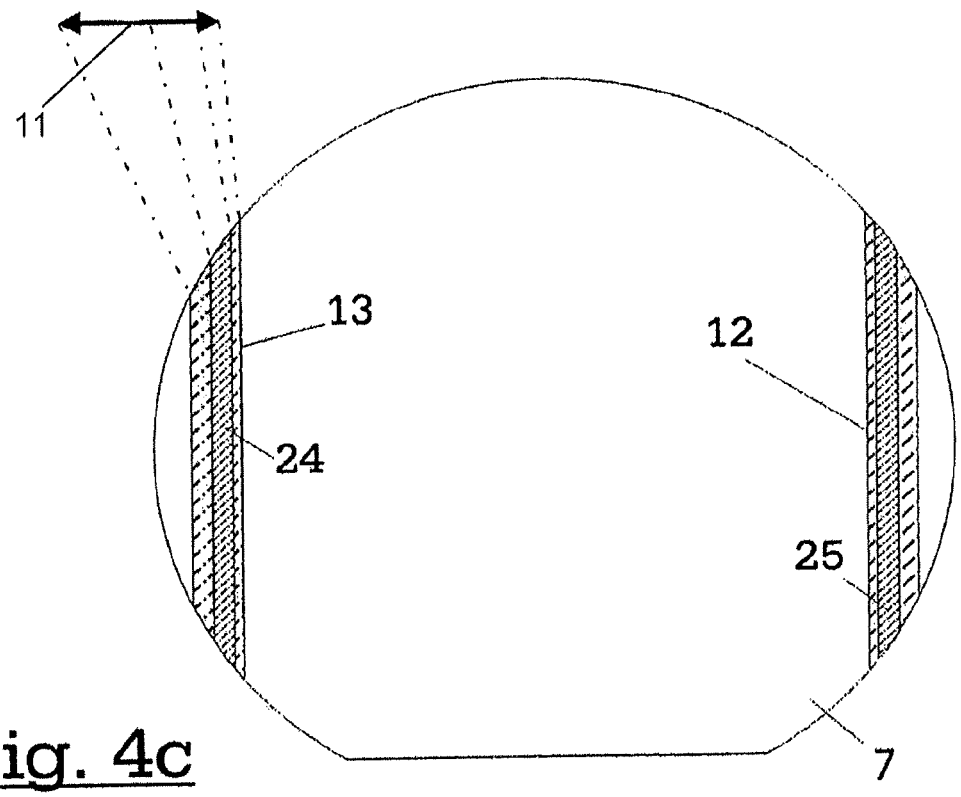
FIG. 4c is a workpiece in top view with the resulting permissible handling zones.

During the lifting and transporting of workpiece 7 the carrying elements 26, 27 are directly in contact on the underside of the disk-shaped workpiece 7. Around each of the carrying elements 26, 27 subsequently a permissible strip-shaped handling zone 24, 25 is defined, within which the carrying elements 26, 27 must move during the handling. The dimensioning of the carrying elements 26, 27 is determined by the open dimensions in the loaded cassette 20. FIG. 4a depicts by example a wafer 3 in a cassette 20, which is bent downwardly compared to a flat wafer 2, both located in slots of the cassette. The downwardly bent wafer 3 is to be lifted and removed from the cassette slot with the carrying elements 26, 27. The maximally permissible thickness 21 of the carrying element 26, 27 is a function of the available interspace between the superjacent and subjacent wafers 3, 2 and the handling tolerances required to move the wafer into the cassette or out of it, as is shown in cross section in FIG. 4b in detail in the critical margin region. In the region proximal to the comb the greatest possible distance between the adjacent wafers 2, 3 corresponds substantially to the comb distance 19, whose position forms the outer position of the permissible handling zone width 23 and the inner limit of the permissible handling zone width 23 is spaced somewhat further away from the comb structure 18 toward the inside, which is limited by the diameter 21 of the carrying element 26, 27 and depends on the deflections of the wafers 2, 3, without coming into mutual contact. From these two possible positions results the permissible handling zone width 23, which determine the permissible handling zones 24, 25, and must lie within the handling zone 12, 13, as is depicted in FIGS. 4b and 4c.

The definitions for the implementation of the cassette imaging system will be explained in the following in conjunction with FIGS. 6a to 6d. Known imaging systems utilize for example reflecting laser systems, in which the read sensor 29 and the reflector 30 are disposed parallel to the wafer surface and oppositely outside of the wafer. The read sensor 29 is also the source of the laser scanning beam 31, which extends also parallel to the wafer surface and is reflected in the reflector 30 back onto the read sensor 29. This beam arrangement with scanning beam 31, read sensor 29 and reflector 30 is guided in known manner close to the region of the center line of the wafer plane. If a wafer is moved into the region of the scanning beam 31, the latter is interrupted and the position is detected. This known method is utilized with relatively thick workpieces or semiconductor wafers which are thicker than 0.6 mm. Problems are encountered with thinner wafers if this method is utilized for the detection. If the wafer is thinner than the diameter of the scanning beam 31, yet is still flat, the scanning beam 31 is not interrupted by the wafer 2. If the imaging system is to detect a loaded or an unloaded slot of the cassette 20, it is not possible to detect this reliably with this method, since the center region of the wafer 2 on which detection takes place, may belong, on the one hand, to a wafer bent upwardly 4 or one bent downwardly 3, as is schematically shown in cross section in FIGS. 6a, 6b and 6c.

To solve the first problem, according to the invention the read sensor 32 and the associated reflector 33 for thin wafers is to be disposed oppositely outside of the plane of the wafer 2, 3, 4 and the read sensor 32 and the reflector 33 is additionally to be disposed somewhat offset outside of the wafer plane, such that the scanning beam 35 is guided slightly tilted with respect to the planar wafer plane 2, from which a preferred tilt angle 34 in the range of 0.5° to 2.0° results.

The small tilt angle 34 of the scanning beam 35 generates a projection of the wafer in the direction of the scanning beam 35 such that a significantly greater thickness 36, the so-called apparent thickness 36, seems present than the involved wafer, in fact, has.

The scanning beam 35 for thin bendable wafers 2, 3, 4 with the read sensor 32 and the reflector 33 are disposed in the margin region of the wafer periphery, thus in the proximity of the comb structure 18, 18' of cassette 20. Consequently, with a viewing direction in the scanning beam direction not a dot-form beam appears as is conventional in known systems, but rather an apparent thickness 36 of wafer 2, 3, 4 depending on the magnitude of the scanning beam tilt angle 34 as is depicted in detail in cross section in FIG. 6c. The scanning beam 34 consequently has the capability of acquiring, apart from planar wafers 2, also corresponding upwardly or downwardly deflected wafers 3, 4, whereby the second problem can also be solved. In order to be able to determine the second problem unambiguously, it is necessary to take into consideration that close to the proximity of the comb structure 18, 18' of cassette 20, where the scanning beam 35 is guided, the vertical distance d between an upwardly bent wafer 4 and a downwardly bent wafer 37 within the same slot configuration is less than the apparent thickness 36 which the tilted scanning beam 35 provides. With the present, known, maximally possible bending degrees of the wafers 3, 4 upwardly and downwardly it is possible to determine the maximum imaging zone width 38. The one limit results through the tips of the comb structure 18, 18' at which an upwardly bent wafer 4 and a downwardly bent wafer 3 were to intersect if these wafers 3, 4 were to lie in an adjacent slot of the comb structure 18, 18'. Consequently two conditions must be maintained in order to be able to detect reliably thin bendable wafers. Firstly, as stated, the apparent thickness 36 in the region of the tilted scanning beam 35 must be greater than the maximally possible distance d in the laser beam region from an upwardly bent wafer 4 and between a downwardly bent wafer 3, if these were to lie in the same slot of cassette 20. As a second condition must be fulfilled that the actual determined handling zone width 39 for the measuring system lies within the maximal imaging zone width 38. From the handling zone width 39, thus determined, result the two imaging zones 40, 41, which are located on both sides of the wafer near the comb structures 18, 18' of cassette 20, within which the scanning beam 35 can be guided and with the read sensor 32 and reflector 33 located outside of the line. In this way within the imaging zone 40, 41 every deformed thin wafer at any location within these zones can be reliably detected.

Figure 7A:
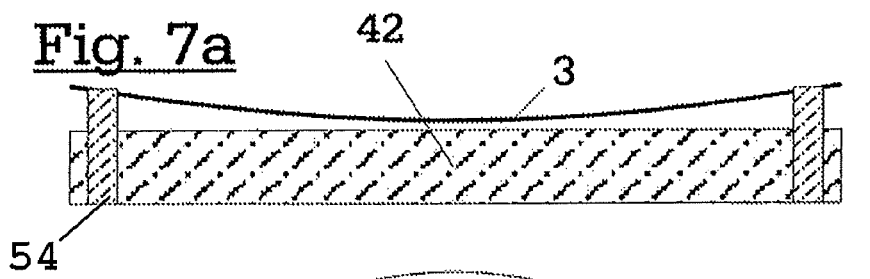
FIG. 7a is a cross section of a bent workpiece with support on posts.
Figure 7B:
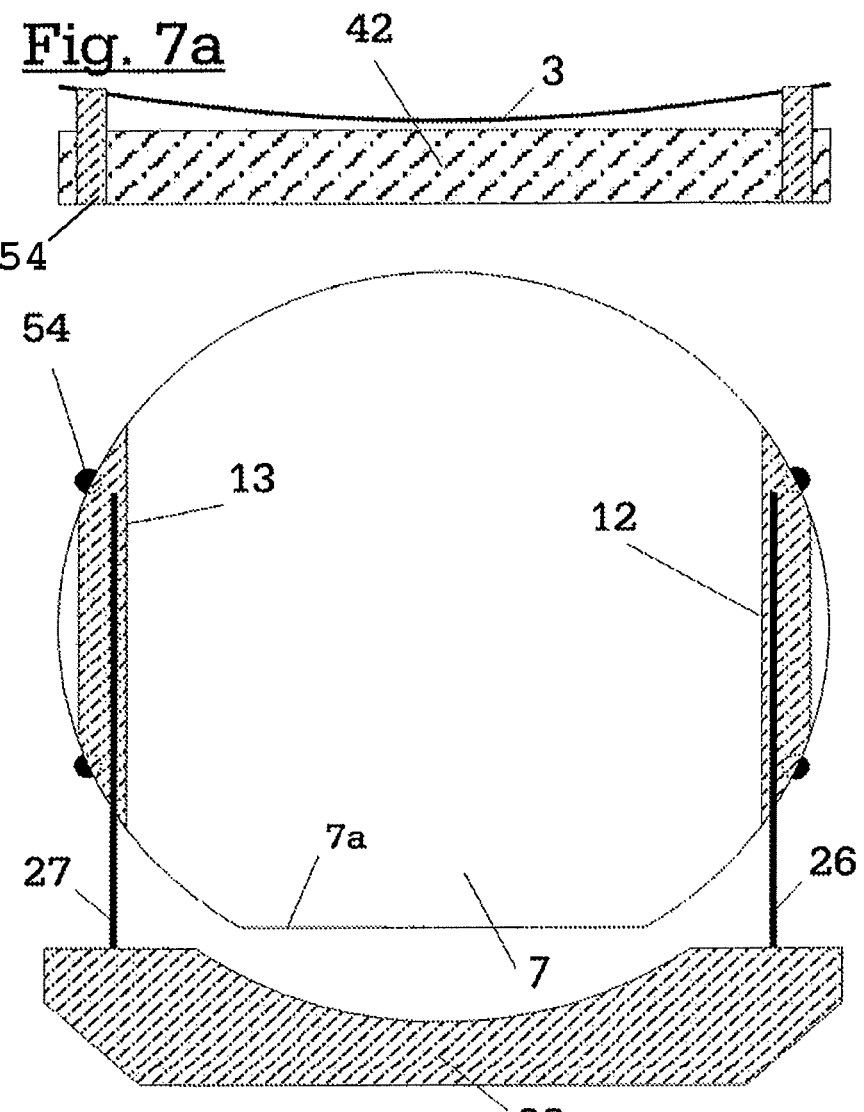
FIG. 7b is a top view of a workpiece according to FIG. 7a with carrying elements guided under the workpiece.

The handling of the wafer is conventionally so carried out that it is positioned and deposited on a flat surface 42 before it is worked in the process station, as is shown in cross section in FIG. 7a. To enable the system to correctly deposit the wafer on the surface, the original support position is generated as in the cassette with supports, which are referred to the handling zones 12, 13 on the wafer. For the generation or maintenance are utilized for example wafer support posts 54, also referred to as pins, on which the wafer 3 rests and which ensure that the distance between base 42 and wafer 3 is large enough to allow carrying elements 26, 27 to be introduced between them as is shown in FIGS. 7a and 7b. The wafer support posts 54 for this procedure are preferably raised, whereby the wafer 3 is lifted from the base 42 and, if it is appropriately thin, is also deflected. To attain the lifting of wafer 3 the wafer base 42 can also be moved in the vertical direction and holding elements other than the so-called wafer support posts 54 can also be utilized for generating the distance between wafer and base 42. In the retracted state of the carrying arms 26, 27, for lifting or depositing the wafer 3 on the base, the latter lies exclusively in contact in the region of the defined handling zones 12, 13 for the transport procedure, with these arms being held on the carrying element mounting 28, which is secured on the robot arm as is shown in FIG. 7b in conjunction with an example of a semiconductor wafer 7.

Figure 8A:
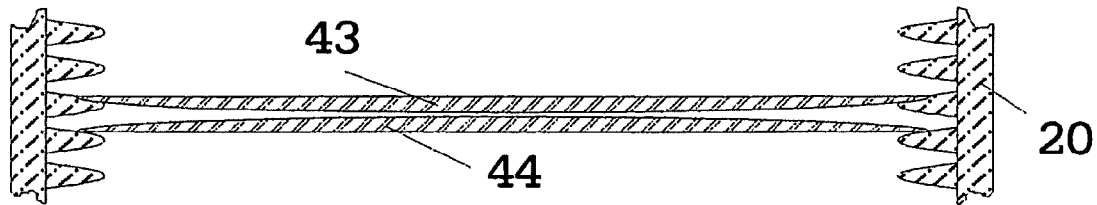
FIG. 8a is a cross section of workpieces deposited in a cassette which are bent with a warp.
Figure 8B:
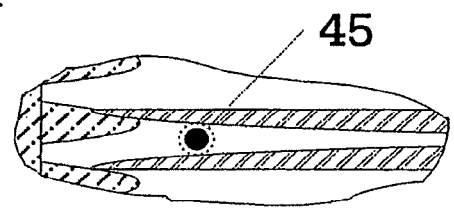
Figure 8C:
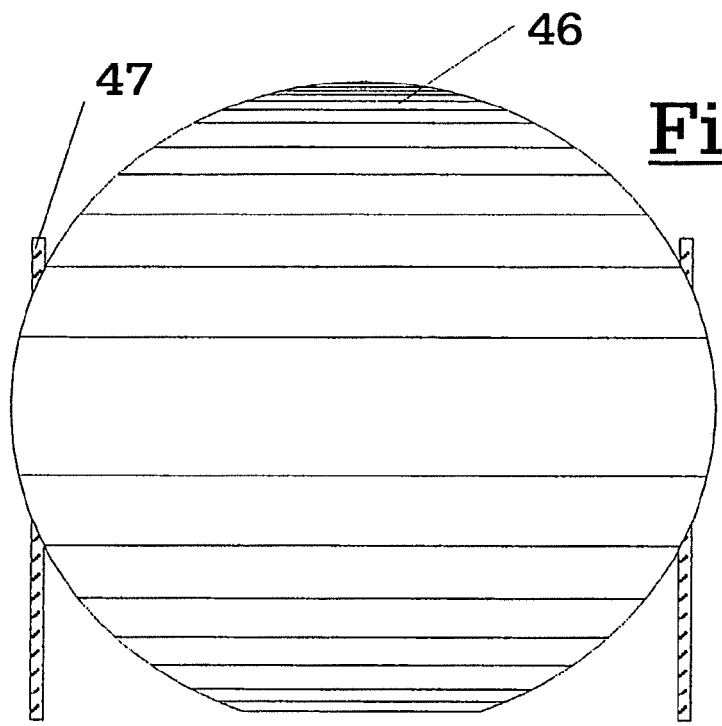
FIG. 8c is a top view of a workpiece with warp deposited on carrying elements.
Figure 8D:
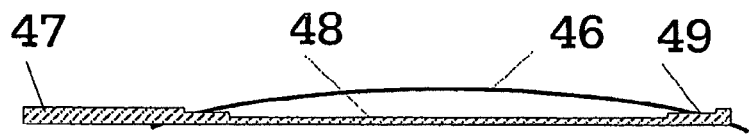
FIG. 8d is a cross section of a workpiece with warp with formed carrying element.

Not all wafers are bent along a cylinder axis parallel to the handling zones which are defined by the system. In the least favorable case wafers in a cassette 20 can also be bent such that they are bent parallel to a cylinder perpendicularly to the support line 6. If such wafers are bent downwardly 44 or upwardly 43 and are placed in a cassette 20, the actual projection and definition of the form is not very different from those described previously. The determination of the cross section 45 of the carrying element 26, 27 and also the other sizes appear identical and do not lead to a different configuration of the system. Carrying elements 26, 27 as depicted, using the carrying element 47 as an example, in cross section in FIG. 8d, can also be implemented formed, in order to adapt themselves to the bent wafer 46. In the present example each of the carrying elements 47 is provided with one step 48 in the peripheral region of wafer 46 such that the wafer 46 can deflect downwardly in the central region and thereby can adapt to a predetermined desired form, preferably to a planar surface in order to be able to accept essentially the previously made considerations directly. In the margin region further steps can preferably be provided in order to be able to secure the wafer there on the carrying element 47 in order to avoid during the transport that the wafer becomes displaced during the transport movement. It is also of advantage to fabricate the carrying element 47 of a material or to coat it with a corresponding material such that a greater surface friction results to decrease the previously described effect.

Figure 9A:
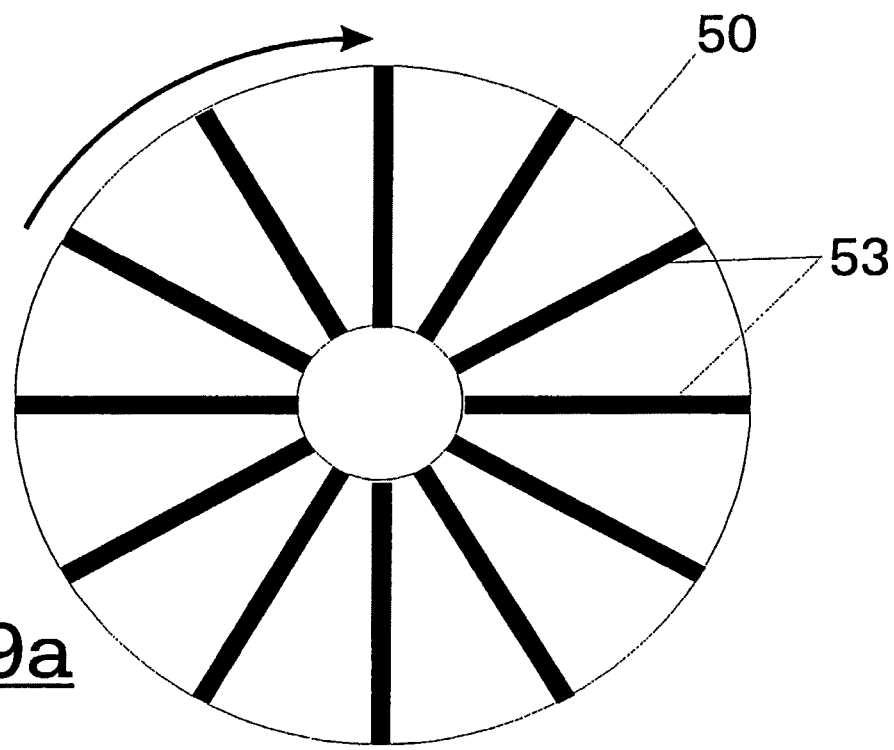
FIG. 9a is a top view of a carrier plate for workpieces with radially disposed carrying elements.
Figure 9B:
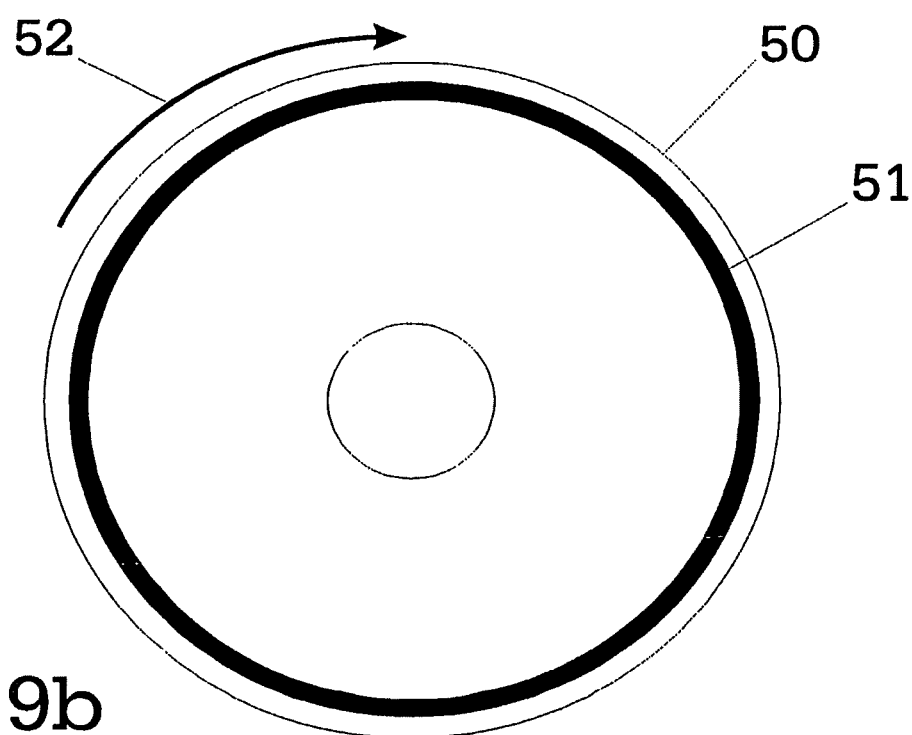
FIG. 9b is a top view of a further carrier plate for workpieces with circularly disposed carrying element.

In a wafer process facility the sole location where the wafer carrying line method is not utilized is the wafer rotation orientation station where wafers are oriented in their planar orientation with respect to a workpiece marker 7a. A wafer which has reached this station is conventionally by definition not oriented to the corresponding marker 7a. This means that the support axes are randomly oriented with respect to the wafer marker 7a. The purpose of this station is to bring the wafer into a clearly defined rotation position in order to work it further. This means that the wafer must be rotated. This rotation movement also leads to a rotation of the support lines about the center of the wafer, which means the support lines before and after the orientation are different. To take this into consideration, it is essential that the wafer regions which must be handled are precisely defined in terms of height and in each rotation position of the wafer. To attain this, a circular support base is advantageously realized for the wafer, which is as close as possible to the support lines or imaging zones 40, 41. As shown in FIG. 9b, for this purpose a support plate 50 is utilized which has a circular support means 51 with a diameter approximating very closely the diameter of the position of the imaging zones 40, 41. When the support configuration, which carries the wafer, is rotated for the orientation 52, the handling system is still capable of lifting the wafer after the orientation. A single circular base configuration 51 is especially well suited if cylindrical deformations of the wafer occur. Similar results can be attained if the wafer is borne by a radially disposed base configuration 53 on the carrier plate 50 for staying the wafer as is depicted in FIG. 9a. This configuration can be utilized with advantage if the workpiece overall is not cylindrically bent.

Figure 10B:
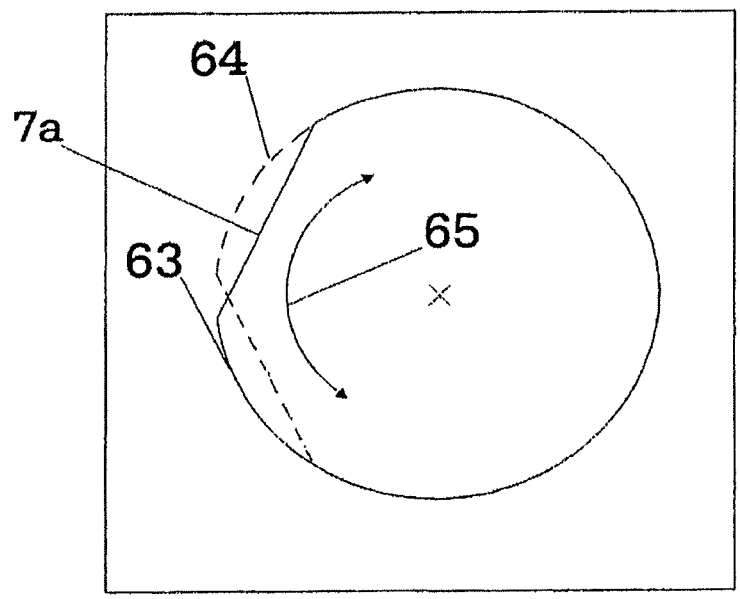
FIG. 10b is a top view of a configuration for the orientation of workpieces.

In some vacuum process facilities for working semiconductor wafers two or more robot systems are employed in order to handle the workpieces and to transport them. An important configuration is for example that in which a first robot 60 is positioned on a facility at atmospheric pressure at the so-called front end, as it is referred to in the semiconductor industry, whereby wafers are transported in and out in cassettes. The second robot 61 can then be positioned in the vacuum process facility, thus under vacuum conditions, in order to transport wafers into the process station and out of the process station. To transport wafers from atmospheric pressure through a lock into a vacuum and back and subsequently wafers from robot 60 to robot 61 located within the vacuum chamber, a substrate transfer station 62 is placed between the two robots 60, 61. If this substrate transfer station is not located on the connection line between the two robot rotation centers 66, 67, the wafers 7 placed by the first robot system onto the position 63 do not have the correct angular orientation with respect to the second robot system at which position 64 would be necessary as is shown in FIGS. 10a and 10b. In this case the substrate transfer station 62 must be provided with means 65 which permit rotating the wafer about the angular difference between the two required wafer positions 63, 64.

What is claimed is:

1. A method for transporting disk-shaped semiconductor workpieces in a vacuum process facility, the workpieces each having a thickness and a total maximum up and down deflection that is due to any internal stress of the workpiece and to the workpiece being supported by opposite peripheral regions of the workpiece, the method comprising:

providing at least one transport robot with a horizontally movable transport arm having one end with only two spaced-apart, elongated and horizontally extending carrying rods for substantially horizontally receiving a workpiece thereon to be transported, each of the only two carrying rods having a diameter;

providing a cassette having opposite sides each with a comb structure with a plurality of vertically spaced combs each in a comb plane that is separated from an adjacent comb by a comb distance corresponding to a maximum vertical system tolerance for substantially horizontally receiving a plurality of vertically spaced workpieces between the combs on each side of the cassette, each workpiece having opposite peripheral regions that are each supported on a comb of the cassette and the cassette being loaded with a plurality of said workpieces;

selected the diameter of the carrying rods and the comb distance between the combs so that the carrying rods can be introduced between two adjacent, spaced-apart combs of the comb structure and be free of contact with the workpieces deposited on the combs and in the cassette;

spacing and positioning the only two carrying rods at the one end of the transport arm so that each rod is located at a respective one of a pair of strip-shaped handling zones in respective peripheral regions of said workpieces, the carrying rods being spaced so that they engage a workpiece only at the respective handling zones, the width of each handling zone and therefore the spacing and positioning of each carrying rod, being determined to prevent further deformation of the workpiece when the carrying rods engage the workpiece, said handling zones being arranged close to and along the comb structures substantially parallel to the comb structures when the workpiece is inserted into the cassette, the width of the handling zones being determined by the sum of the maximum up and down deflections of the workpiece when lying on a horizontal plane;

horizontally moving the transport arm with respect to the cassette for to insert the carrying rods into the space between combs on which a workpiece to be moved is supported and under respective handling zones of the peripheral region of the workpiece to be moved;

thereafter lifting the transport arm with respect to the cassette to bring the carrying rods into engagement with the handling zones of the workpiece to be moved and for lifting the workpiece to be moved from the combs;

thereafter horizontally moving the transport arm with respect to the cassette to remove the workpiece to be moved and that is now engages on the carrying rods, from the cassette;

using a scanning beam having an optical path and being in a region along and between two adjacent comb planes on one side of the cassette for detecting a workpiece in a workpiece plane in the cassette and for detecting the presence of a workpiece in the cassette, said scanning beam emanating beside a comb on one side of the cassette and close to one of the peripheral regions of said workpiece; and positioning a height of the scanning beam relative to the cassette and tilting the scanning beam at a small angle with respect to the horizontal plane so that the scanning beam generates a projection of the workpiece which is of significantly greater thickness than an actual thickness of the workpiece, wherein the angle of tilt of the scanning beam is defined such that when the beam is guided along two adjacent parallel combs, the comb distance is not exceeded.

2. The method of claim 1, wherein the workpieces have a diameter of 100 mm to 300 mm, a thicknesses of 0.07 mm to approximately 0.6 mm and the handling zones are each 10 to 20 mm wide.

3. The method of claim 1, including vertically moving the cassette for effecting the lifting the transport arm with respect to the cassette to bring the carrying rods into engagement with the handling zones of the workpiece to be moved and for lifting the workpiece to be moved from the combs.

4. The method of claim 1, including providing at one end of the horizontally disposed comb structure at least one stop means for delimiting an end position of the workpiece in the cassette, said stop means being disposed outside of the optical path of the scanning beam.

5. The method of claim 1, including a second permissible handling zone width, which is smaller than the width of the first mentioned handling zone and which is located within said first mentioned handling zone, and wherein said second handling zone width is determined by the diameter of the carrying rods and a permissible handling zone width that is still free at maximally possible deflections of the workpiece.

6. The method of claim 1, including providing a further, tilted scanning beam in the proximity of the comb structure positioned on the opposite side of the cassette from where said first mentioned scanning beam.

7. The method of claim 1, including providing at least two transport robots each rotatable about an axis and each comprising one transport arm and a rotating mechanism for orienting the handling zones of the workpieces with respect to a transport direction of the transport arms.

8. The method of claim 1, wherein the angle of tilt of the scanning beam is 0.5 to 2.0 degrees.

9. The method of claim 1, wherein the angle of tilt of the scanning beam is defined such that when the beam is guided along two adjacent parallel combs the comb distance is not exceeded.

10. The method of claim 1, wherein the workpieces have a diameter of 100 mm to 300 mm.

11. The method of claim 1, wherein the workpieces have a thicknesses of 0.07 mm to approximately 0.6 mm.

12. The method of claim 1, wherein the handling zones are each 10 to 20 mm wide.

13. A method for transporting disk-shaped workpieces in a vacuum process facility, the workpieces each having a thickness and a total maximum up and down deflection that is due to any internal stress of the workpiece and to the workpiece being supported by opposite peripheral regions of the workpiece, the method comprising:

providing a transport robot with a horizontally movable transport arm having one end with only two spaced-apart, elongated and horizontally extending carrying elements for substantially horizontally receiving a workpiece thereon to be transported;

providing a cassette having opposite sides each with a comb structure with a plurality of vertically spaced combs each in a comb plane that is separated from an adjacent comb by a comb distance corresponding to a maximum vertical system tolerance for substantially horizontally receiving a plurality of vertically spaced workpieces between the combs on each side of the cassette, each workpiece having opposite peripheral regions that are each supported on a comb of the cassette and the cassette being loaded with a plurality of said workpieces;

selected the comb distance between the combs so that the carrying elements can be introduced between two adjacent, spaced-apart combs of the comb structure and be free of contact with the workpieces deposited on the combs and in the cassette;

spacing and positioning the only two carrying elements at the one end of the transport arm so that each element is located at a respective one of a pair of strip-shaped handling zones in respective peripheral regions of the workpieces, the carrying elements being spaced so that they engage a workpiece only at the respective handling zones, the width of each handling zone and therefore the spacing and positioning of each carrying elements, being selected to prevent further deformation of the workpiece when the carrying elements engage the workpiece, said handling zones being arranged close to and along the comb structures substantially parallel to the comb structures when the workpiece is inserted into the cassette, the width of the handling zones being determined by the sum of the maximum up and down deflections of the workpiece when lying on a horizontal plane;

horizontally moving the transport arm with respect to the cassette for to insert the carrying element into the space between combs on which a workpiece to be moved is supported and under respective handling zones of the peripheral region of the workpiece to be moved;

thereafter lifting the transport arm with respect to the cassette to bring the carrying elements into engagement with the handling zones of the workpiece to be moved and for lifting the workpiece to be moved from the combs; and thereafter horizontally moving the transport arm with respect to the cassette to remove the workpiece to be moved and that is now engaged on the carrying element, from the cassette.

14. The method of claim 13, wherein the workpieces have a diameter of 100 mm to 300 mm, a thicknesses of 0.07 mm to approximately 0.6 mm and the handling zones are each 10 to 20 mm wide.

15. The method of claim 13, including vertically moving the cassette for effecting the lifting the transport arm with respect to the cassette to bring the carrying elements into engagement with the handling zones of the workpiece to be moved and for lifting the workpiece to be moved from the combs.

16. The method of claim 13, including providing at one end of the horizontally disposed comb structure at least one stop means for delimiting an end position of the workpiece in the cassette.

17. The method of claim 13, including a second permissible handling zone width, which is smaller than the width of the first mentioned handling zone and which is located within said first mentioned handling zone, and wherein said second handling zone width is determined by a diameter of the carrying elements which comprise cylindrical rods and a permissible handling zone width that is still free at maximally possible deflections of the workpiece.

18. The method of claim 13, including providing a pair of tilted scanning beams in the proximity of the comb structure on opposite sides of the cassette and using the beams to detect the presence of a workpiece in the cassette.

19. The method of claim 13, including providing at least two transport robots each rotatable about an axis and each comprising one transport arm and a rotating mechanism for orienting the handling zones of the workpieces with respect to a transport direction of the transport arms.

\* \* \* \* \*